(12) United States Patent
Hemmi

(10) Patent No.: US 8,591,267 B2
(45) Date of Patent: Nov. 26, 2013

(54) CONTACT HEAD, PROBE PIN INCLUDING THE SAME, AND ELECTRICAL CONNECTOR USING THE PROBE PIN

(75) Inventor: Akihiko Hemmi, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 13/386,809

(22) PCT Filed: Mar. 25, 2011

(86) PCT No.: PCT/JP2011/001790
§ 371 (c)(1),
(2), (4) Date: Jan. 24, 2012

(87) PCT Pub. No.: WO2011/161855
PCT Pub. Date: Dec. 29, 2011

(65) Prior Publication Data
US 2012/0122355 A1    May 17, 2012

(30) Foreign Application Priority Data

Jun. 23, 2010  (JP) ................................ 2010-142840

(51) Int. Cl.
*H01R 13/24* (2006.01)
(52) U.S. Cl.
USPC ........................................................ 439/700
(58) Field of Classification Search
USPC ................... 439/700, 66, 591, 169, 219, 482
See application file for complete search history.

(56) References Cited

U.S. PATENT DOCUMENTS

| 7,393,214 B2 * | 7/2008 | DiStefano ........................ 439/66 |
| 2008/0042676 A1 | 2/2008 | Yamada et al. |

FOREIGN PATENT DOCUMENTS

| JP | U-47-25151 | 11/1972 |
| JP | A-2004-273398 | 9/2004 |
| JP | A-2005-243358 | 9/2005 |
| JP | A-2006-337202 | 12/2006 |
| JP | A-2008-39496 | 2/2008 |
| JP | A-2008-45986 | 2/2008 |
| JP | A-2009-180549 | 8/2009 |
| WO | WO 2005/057652 A2 | 6/2005 |

OTHER PUBLICATIONS

International Search Report dated Jun. 7, 2011 in International Application No. PCT/JP2011/001790 (with translation).
Written Opinion of the International Searching Authority dated Jun. 7, 2011 in International Application No. PCT/JP2011/001790 (with partial translation).

* cited by examiner

*Primary Examiner* — Felix O Figueroa
(74) *Attorney, Agent, or Firm* — Oliff & Berridge, PLC

(57) ABSTRACT

The contact head includes a head base, and at least two elastic contact pieces located on an upper end portion of the head base and configured to electrically contact a contact target object. A dent having a circular horizontal cross-sectional shape is formed at a central portion surrounded by the at least two elastic contact pieces. Additionally, each of the elastic contact pieces is formed with a tip end serving as a free end of the elastic contact piece located on a circumference of at least one virtual circle which is a circle concentric with an inscribed circle inscribed in a horizontal cross-sectional shape of the head base and which has a diameter being the same as or smaller than a diameter of the inscribed circle. Moreover, the contact piece is formed to be elastically deformable in a vertical direction by being formed to extend spirally.

8 Claims, 23 Drawing Sheets

CONTACT HEAD, PROBE PIN INCLUDING THE SAME, AND ELECTRICAL CONNECTOR USING THE PROBE PIN

TECHNICAL FIELD

The present invention relates to a contact head to electrically contact an electrode of a contact target object, a probe pin including the contact head, and an electrical connector using the probe pin.

BACKGROUND ART

A probe pin as disclosed in PTL 1, for example, has heretofore been known as a contact configured to electrically contact an electrode formed on a contact target object such as an IC (integrated circuit) package, an IC wafer or a display panel at a given pressure.

The probe pin disclosed in PTL 1 is formed of a shaft portion and a contact head joined to one end portion of the shaft portion. The shaft portion constituting the probe pin is formed by cutting or forging a rod material made of brass, beryllium copper, phosphor bronze or the like. Meanwhile, the contact head is formed by electroforming using nickel or tungsten as metal to be formed.

A multiple or single pointed end is provided at one end portion of the contact head. The pointed end is brought into contact with an electrode formed on a contact target object, and thus electrically contacts the electrode while applying a given contact pressure.

Note that PTL 1 also discloses that the pointed end is formed on the one end portion of the shaft portion by directly cutting the one end portion.

Citation List

Patent Literature

PTL 1: Japanese Patent Laid-Open No. 2006-337202

SUMMARY OF THE INVENTION

Technical Problems

Each of the pointed ends as contact pieces provided on the one end portion of the shaft portion or the contact head according to PTL 1 is formed as a rigid body. Therefore, the contact between the pointed end and the electrode of the contact target object is in the state where a rigid body and another rigid body is brought and kept in contact with each other while applying a given contact pressure. Here, if the hardness of the pointed end is lower than the hardness of the electrode, the pointed end may be crushed in pressure contact. In particular, it is highly probable that the pointed end will be crushed with multiple times of pressure contact of the pointed end with the electrode. The crush of the pointed end as described above leads to lowering of reliability of contact between an electrode and the pointed end after multiple times of pressure contact. On the other hand, if the hardness of the pointed end is higher than the hardness of the electrode, a problem may occur that the electrode may be heavily damaged by flaws or deformation. In addition, in regard to contact between components during manufacturing or transportation, the pointed ends hitting other components may cause similar problems and thereby may degrade quality as products.

In view of the aforementioned problems, it is an object of the present invention to provide a contact head capable of reducing crush of a contact piece and damage on an electrode, a probe pin including the contact head, and an electrical connector using the probe pin.

Solution to Problem

In order to achieve the above object, a contact head according to the present invention comprises: a head base; and at least two elastic contact pieces located on an upper end portion of the head base and configured to electrically contact a contact target object, wherein a dent having a circular horizontal cross-sectional shape is formed at a central portion surrounded by the at least two elastic contact pieces, and each of the elastic contact pieces is formed to be elastically deformable in a vertical direction by being formed to extend spirally with a tip end serving as a free end of the elastic contact piece located on a circumference of at least one virtual circle which is a circle concentric with an inscribed circle inscribed in a horizontal cross-sectional shape of the head base and which has a diameter being the same as or smaller than a diameter of the inscribed circle.

In the contact head according to the present invention, each of the elastic contact pieces of the contact head may also be formed to extend toward its tip end at an inclination with respect to the upper end surface of the head base.

In the contact head according to the present invention, a horizontal cross-sectional shape of the head base may also be a regular polygon.

Moreover, in the contact head according to the present invention, at least two of the elastic contact pieces may be line-symmetrically arranged.

A probe pin according to the present invention at least includes the contact head located on an upper end portion thereof while an electrical connector includes two or more of the probe pins.

Advantageous Effects of the Invention

In the contact head according to the present invention, the elastic contact piece is formed spirally along the virtual circle having the smaller diameter than the diameter of the inscribed circle of the head base. Hence the elastic contact piece is elastically deformable in the vertical direction. Accordingly, the crush or deformation as observed in the conventional pointed end is either totally eliminated or reduced even when the pointed end comes into contact with the electrode. In addition, unintended damage on the electrode can be avoided. Meanwhile, the pointed ends can be manufactured easily by cutting work in spite of the more complicated structure than that of the conventional pointed ends because the dent is formed at the central portion. Further, since the tip end of the elastic contact piece is not deformed outward beyond the contour of the head base, this structure can cope with narrower pitches when used in the probe pin.

Meanwhile, in the contact head according to the present invention, the elastic contact piece is formed to extend toward the tip end at an inclination with respect to the upper end surface of the head base. Hence the contact piece is allowed to wipe a contact target object.

DESCRIPTION OF EMBODIMENTS

With reference to the drawings, a description will be given below of a contact head according to the present invention, a probe pin including the contact head, and an electrical connector using the probe pin.

Figure 23:
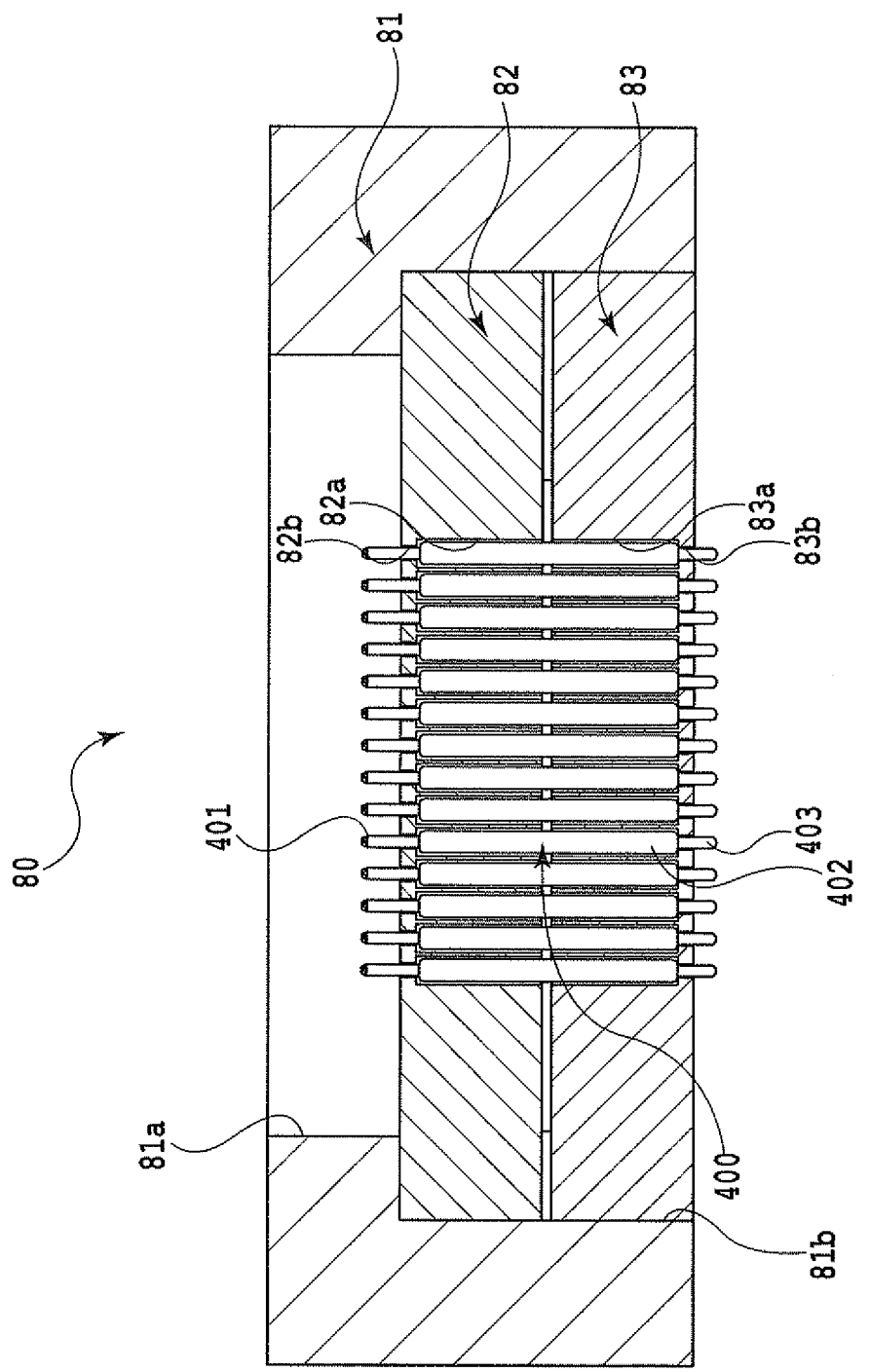
FIG. 23 shows an example of an electrical connector using the probe pins which include the contact heads according to the present invention.

First of all, an electrical connector 80 employing a contact head according to the present invention will be briefly described by using FIG. 23.

As shown in FIG. 23, the electrical connector 80 generally includes a casing member 81, a first socket base member 82, a second socket base member 83, and multiple probe pins 400 serving as contacts. Although illustration is omitted in FIG. 23, the electrical connector 80 electrically connects an IC package being a first contact target object to a wiring board such as a test board being a second contact target object.

The casing member 81 is made of a metallic material or an electrically insulative synthetic resin material, and is formed into a substantially rectangular parallelepiped shape. A rectangular through hole 81a configured to penetrate the casing member 81 and a housing recess 81b opened downward are formed in the casing member 81. The rectangular through hole 81a has a rectangular shape in a horizontal cross-section and forms an IC package mounting space. The housing recess 81b has a rectangular shape in the horizontal cross-section, which is greater than the horizontal cross-sectional shape of the rectangular through hole 81a and is similar to the shape of the rectangular through hole 81a, and is formed to be able to house the first and second socket base members 82 and 83.

The first socket base member 82 is made of an electrically insulative material and is formed into a substantially rectangular parallelepiped shape. Multiple first cylindrical through holes 82a are formed in the first socket base member 82 so as to correspond to external contact points (electrodes) such as multiple solder balls provided on the IC package to be mounted inside the IC package mounting space. The multiple first cylindrical through holes 82a are formed in order to house part of the probe pins 400 that contact the multiple electrodes on the IC package, and are therefore arranged in a matrix fashion similarly to the layout of the electrodes on the IC package. Here, each of the multiple first cylindrical through holes 82a includes a small diameter portion 82b having a smaller diameter than that of the first cylindrical through hole 82a in order to prevent the probe pin 400 from falling out of the through hole 82a upward. As described later, a head base of a contact head constituting an upper plunger 401 of the probe pin 400 is fitted into the small diameter portion 82b. The second socket base member 83 is made of an electrically insulative material and is formed into a substantially rectangular parallelepiped shape as similar to the first socket base member 82. Multiple second cylindrical through holes 83a are formed in the second socket base member 83 so as to correspond to the multiple first cylindrical through holes 82a provided in the first socket base member 82. The second cylindrical through holes 83a are arranged in a matrix fashion similarly to the first cylindrical through holes 82a. Here, each of the multiple second cylindrical through holes 83a includes a small diameter portion 83b having a smaller diameter than that of the second cylindrical through hole 83a in order to prevent the probe pin 400 from falling out of the through hole 83a downward. A lower plunger 403 of the probe pin 400 is fitted into the small diameter portion 83b. As shown in FIG. 23, the first cylindrical through holes 82a provided in the first socket base member 82 form probe pin housing spaces to house the probe pins 400 to be described later together with the corresponding second cylindrical through holes 83a provided in the second socket base member 83.

Each of the multiple probe pins 400 shown in FIG. 23 employs the probe pin 400 shown in FIG. 17 to be described later. The probe pin 400 includes the upper plunger 401 which are formed of the contact head according to the present invention, a cylinder 402, and the lower plunger 403, and a coil spring 404 which is not illustrated in FIG. 23. The probe pin 400 will be described in detail with reference to FIG. 17 and further explanation will therefore be omitted.

After the cylinders 402 of the multiple probe pins 400 are housed in the probe pin housing spaces, the first and second socket base members 82 and 83 are housed in the housing recess 81b of the casing member 81 and fixed thereto by using a fixing member such as a bolt.

In the electrical connector 80 shown in FIG. 23, the IC package is guided into the rectangular through hole 81a formed in the casing member 81 and the IC package is pressed against the multiple probe pins 400 by using an unillustrated pressing plate or the like. At this time, elastic contact pieces provided on an upper end of the upper plunger 401 of the probe pin 400 electrically contact an electrode of the IC package. Meanwhile, a contact point provided on a lower end of the lower plunger 403 is electrically connected to an external contact point (an electrode) of a printed wiring board such as a test board.

Next, details of the contact head according to the present invention will be described. FIGS. 1A to 11 show typical examples of contact heads according to the present invention.

Figure 1A:
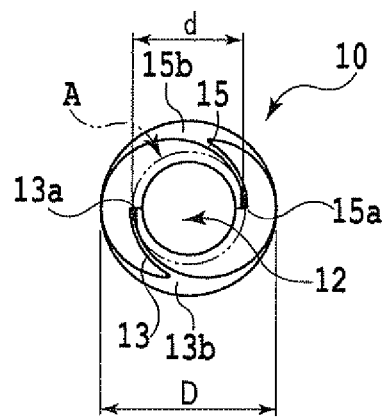
FIG. 1A is a top view of an example of a contact head according to the present invention, in which the number of elastic contact pieces provided at one end portion of the contact head is 2.
Figure 1B:
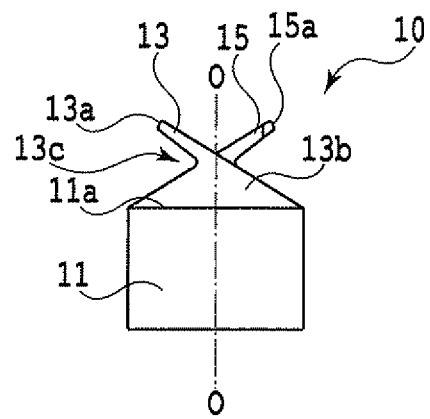
FIG. 1B is a side view of the contact head shown in FIG. 1A.

FIG. 1 shows a contact head according to Example 1 of the present invention. A contact head 10 in the example shown in FIG. 1 is formed by cutting a metallic material such as brass, beryllium copper or phosphor bronze, and includes a head base 11 and two elastic contact pieces 13 and 15. The head base 11 of the contact head 10 according to this example is formed into a cylindrical shape having a circular horizontal cross-sectional shape and has a central axis line O-O which extends in an up-and-down (vertical) direction as shown in FIG. 1B.

Figure 1C:
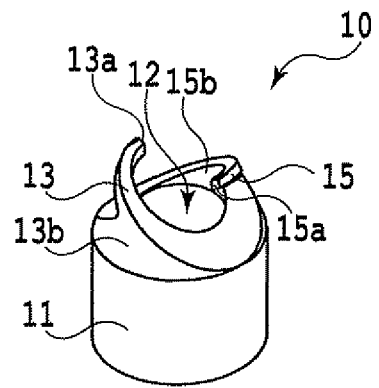
FIG. 1C is a perspective view of the contact head shown in FIG. 1A.
Figure 19E:
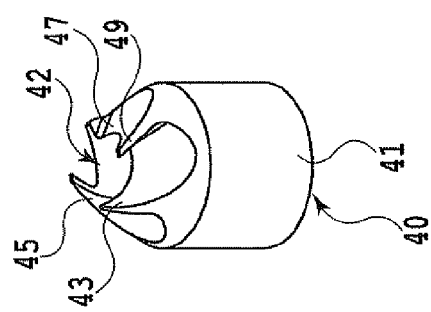
FIG. 19E is a process drawing for explaining manufacturing of a contact head according to the present invention, which shows a manufacturing step 5.
Figure 19D:
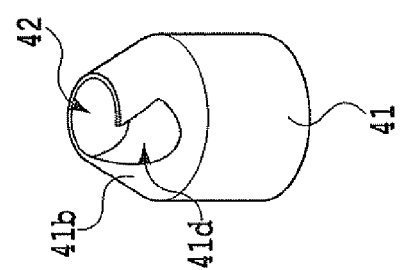
FIG. 19D is a process drawing for explaining manufacturing of a contact head according to the present invention, which shows a manufacturing step 4.
Figure 19C:
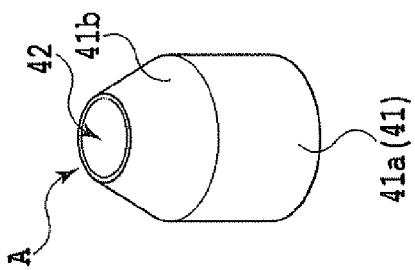
FIG. 19C is a process drawing for explaining manufacturing of a contact head according to the present invention, which shows a manufacturing step 3.

The two elastic contact pieces 13 and 15 respectively include base end portions 13b and 15b continuous to an upper end portion (a tip end portion) of the head base 11, and tips 13a and 15a serving as free ends thereof. In this example, the two elastic contact pieces 13 and 15 are formed in point-symmetric positions with respect to the central axis line O-O. Moreover, the tips 13a and 15a are formed to be located on a circumference of a virtual circle A being a circle concentric with a horizontal cross-sectional circle of the head base 11 in the cylindrical shape and having a diameter d which is either the same as or smaller than a diameter D of the horizontal cross-sectional circle. To be more precise, as shown in FIGS. 1A and 1C, the two elastic contact pieces 13 and 15 are formed to extend spirally clockwise from the respective base end portions 13b and 15b and to extend toward the respective tips at an inclination with respect to a horizontal upper end surface of the head base 11. Here, a dent 12 having either a cylindrical shape or an inverted cone shape (a shape configured to gradually reduce the diameter toward a lower end in FIG. 1B), though the contour thereof is not clear in FIGS. 1A to 1C, is formed at a central portion surrounded by the two elastic contact pieces 13 and 15. Incidentally, the shape of the dent 12 in this example is the inverted cone shape. The dent 12 is formed either into the cylindrical shape or into the inverted cone shape in the process of manufacturing the contact head to be described later (see FIG. 19C). No matter whether the shape of the dent 12 is cylindrical or of the inverted cone, the diameter of an uppermost end (in the manufacturing process) of the dent 12 formed at the time of manufacture is substantially equal to the diameter d of the virtual circle A (see FIGS. 19B and 19C). As described later, formation of the dent 12 determines the size of the virtual circle A to locate the respective tips 13a and 15a of these two elastic contact pieces 13 and 15, and facilitates manufacturing of the elastic contact pieces at the same time. Meanwhile, as shown in FIG. 1A, the two elastic contact pieces 13 and 15 are formed to be tapered toward the respective tips 13a and 15a when viewed from above. Moreover, as shown in FIG. 1B, deformation spaces are respectively formed below the two contact pieces 13 and 15 which extend obliquely upward from the base end portion 13b and are inclined with respect to a horizontal upper end surface 11a of the head base 11. Only a deformation space 13c below the contact piece 13 is shown in FIG. 1B. As the deformation spaces are respectively formed below the two elastic contact pieces 13 and 15, tip end regions including the two elastic contact pieces 13 and 15 as well as the respective tips 13a and 15a become elastically displaceable in the up-and-down (vertical) direction. The shape of the tips 13a and 15a is preferably pointed. However, without limitations to the foregoing, a shape having a flat portion or a rounded shape may be employed, for example. Here, even when the diameter d of the virtual circle A for locating the tips 13a and 15a of the elastic contact pieces 13 and 15 is equal to the diameter D of the horizontal cross-sectional circle of the head base 11 as described previously, the elastic contact pieces 13 and 15 are deformed only in the up-and-down direction and not outward in a radial direction. This is because the second moment of cross section in the radial direction becomes greater than the second moment of cross section in the up-and-down direction as the elastic contact pieces 13 and 15 are formed into the shape so as to spread out wide from the respective tips 13a and 15a toward the respective base end portions 13b and 15b as described previously.

Figure 2A:
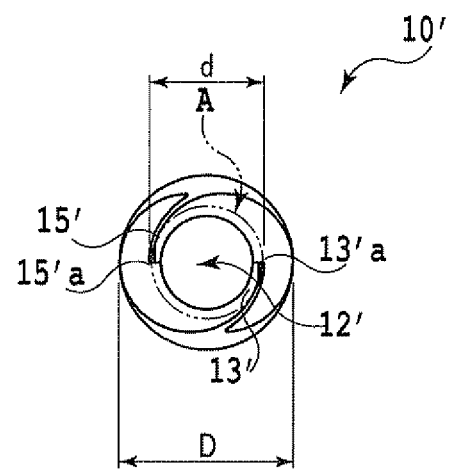
FIG. 2A is a top view of another example of a contact head according to the present invention, in which the number of elastic contact pieces provided at one end portion of the contact head is 2.
Figure 2B:
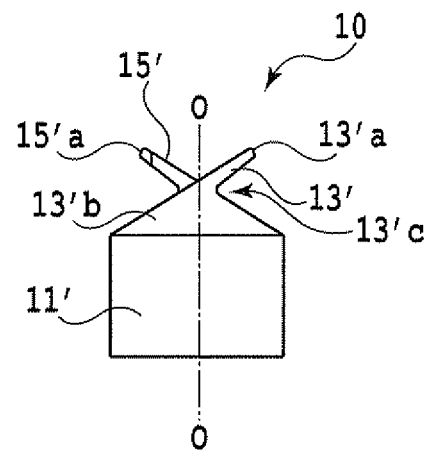
FIG. 2B is a side view of the contact head shown in FIG. 2A.
Figure 2C:
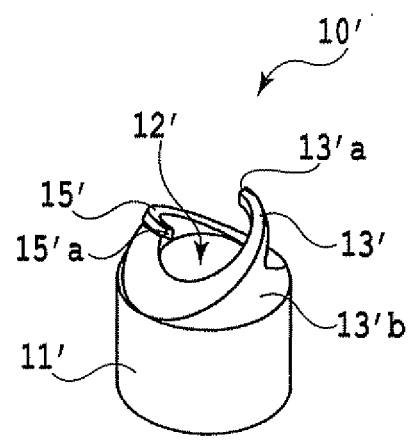
FIG. 2C is a perspective view of the contact head shown in FIG. 2A.

FIGS. 2A to 2C show a contact head 10' according to Example 2 of the present invention. The configuration of the contact head 10' shown in FIGS. 2A to 2C is different from that of the contact head 10 of the example shown in FIGS. 1A to 1C only in that two elastic contact pieces 13' and 15' are formed spirally counterclockwise. However, regarding other features, the configuration of the contact head 10' of this example is identical to the configuration of the example shown in FIG. 1A to 1C. Therefore, the configuration of the contact head 10' in this example can be understood by reading the description of the example shown in FIGS. 1A to 1C above while attaching a suffix "'" to the reference numerals.

Figure 3A:
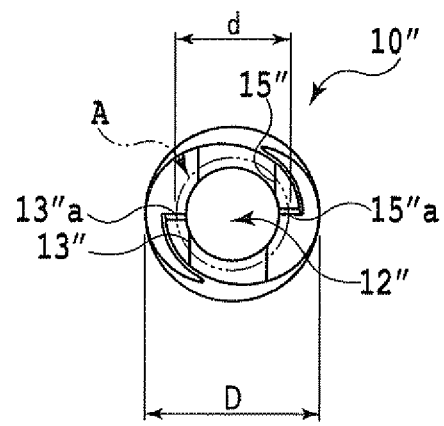
FIG. 3A is a top view of still another example of a contact head according to the present invention, in which the number of elastic contact pieces provided at one end portion of the contact head is 2.
Figure 3B:
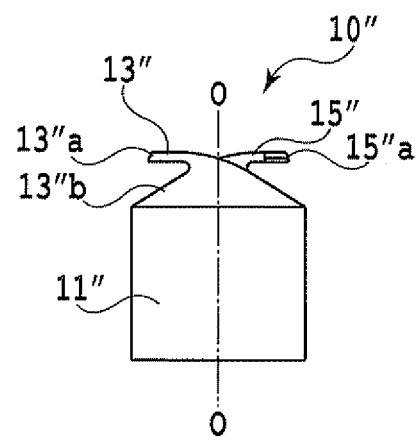
FIG. 3B is a side view of the contact head shown in FIG. 3A.
Figure 3C:
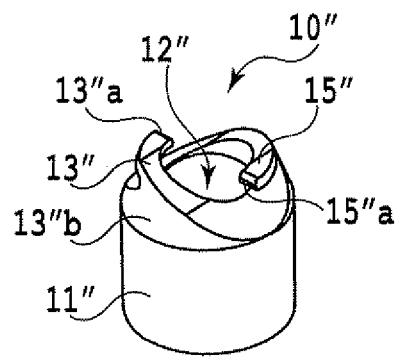
FIG. 3C is a perspective view of the contact head shown in FIG. 3A.

FIGS. 3A to 3C show a contact head 10" according to Example 3 of the present invention. The configuration of the contact head 10" shown in FIGS. 3A to 3C is different from that of the contact head 10 of the example shown in FIGS. 1A to 1C only in that tip end portions including tips 13"a and 15"a of two elastic contact pieces 13" and 15" are formed almost horizontally. Regarding other features, the configuration of the contact head 10' of this example is also identical to the configuration of the example shown in FIG. 1A to 1C. Therefore, the configuration of the contact head 10" in this example can also be understood by reading the description of the example shown in FIGS. 1A to 1C above while attaching a suffix """ to the reference numerals.

Figure 4A:
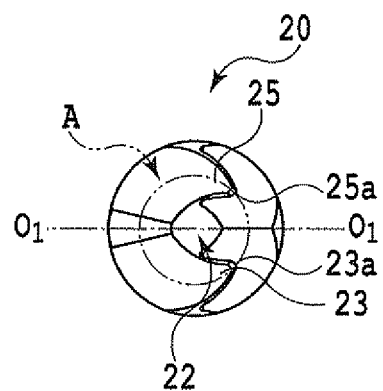
FIG. 4A is a top view of still another example of a contact head according to the present invention, in which the number of elastic contact pieces provided at one end portion of the contact head is 2.
Figure 4B:
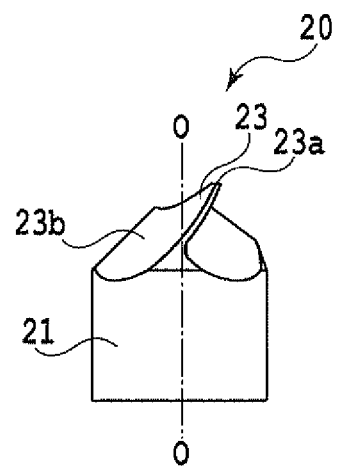
FIG. 4B is a side view of the contact head shown in FIG. 4A.
Figure 4C:
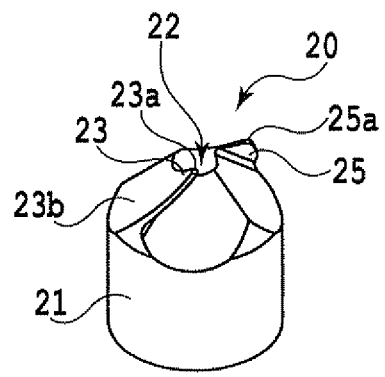
FIG. 4C is a perspective view of the contact head shown in FIG. 4A.

FIGS. 4A to 4C show a contact head 20 according to Example 4 of the present invention. The configuration of the contact head 20 shown in FIGS. 4A to 4C is different from that of the contact head 10 of the example shown in FIGS. 1A to 1C only in that two elastic contact pieces 23 and 25 are formed line-symmetrically with respect to a center line $O_1$-$O_1$ (see FIG. 4A), which is orthogonal to a central axis line O-O of a head base 21. Regarding other features, the configuration of the contact head 20 of this example is also identical to the configuration of the example shown in FIG. 1A to 1C. Therefore, the configuration of the contact head 20 in this example can also be understood by reading the description of the example shown in FIGS. 1A to 1C above while replacing 1 in the tenths place of the reference numerals with 2.

Figure 5A:
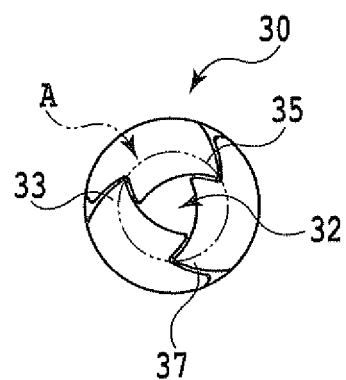
FIG. 5A is a top view of an example of a contact head according to the present invention, in which the number of elastic contact pieces provided at one end portion of the contact head is 3.
Figure 5B:
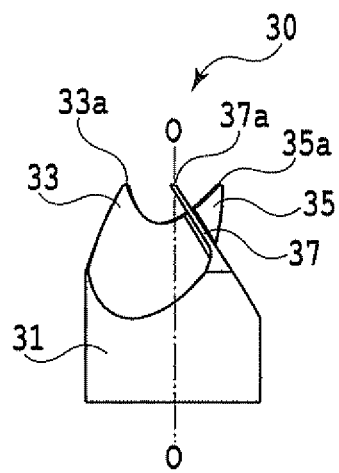
FIG. 5B is a side view of the contact head shown in FIG. 5A.
Figure 5C:
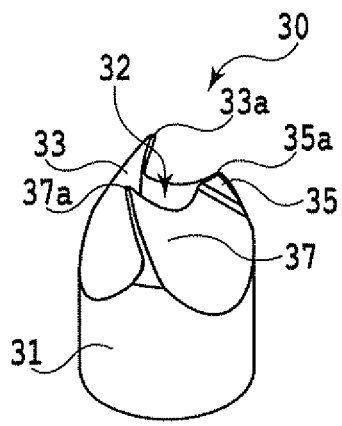
FIG. 5C is a perspective view of the contact head shown in FIG. 5A.

FIGS. 5A to 5C show a contact head 30 according to Example 5 of the present invention. The configuration of the contact head 30 shown in FIGS. 5A to 5C is different from that of the contact head 10 of the example shown in FIGS. 1A to 1C only in that three elastic contact pieces 33, 35, and 37 respectively provided with tips 33a, 35a, and 37a serving as free ends are formed. Regarding other features, the configuration of the contact head 30 of this example is also identical to the configuration of the example shown in FIG. 1A to 1C and description of the configuration will therefore be omitted. It is to be noted that the configuration of the contact head 30 in this example can also be understood by reading the description of the example shown in FIGS. 1A to 1C above while replacing 1 in the tenths place of the reference numerals with 3.

Figure 6A:
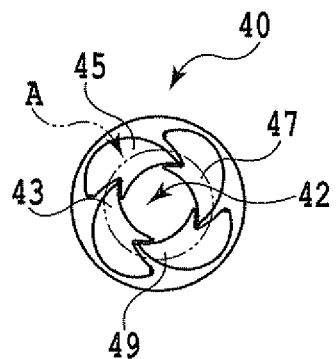
FIG. 6A is a top view of an example of a contact head according to the present invention, in which the number of elastic contact pieces provided at one end portion of the contact head is 4.
Figure 6B:
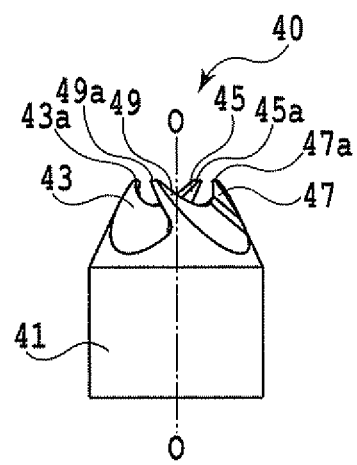
FIG. 6B is a side view of the contact head shown in FIG. 6A.
Figure 6C:
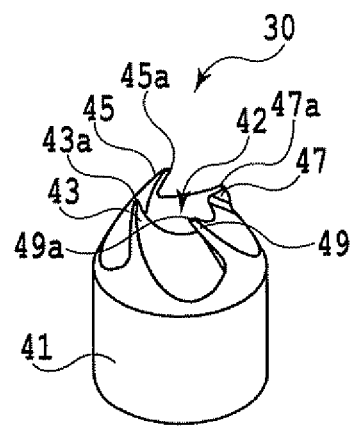
FIG. 6C is a perspective view of the contact head shown in FIG. 6A.

FIGS. 6A to 6C show a contact head 40 according to Example 6 of the present invention. The configuration of the contact head 40 shown in FIGS. 6A to 6C is different from that of the contact head 10 of the example shown in FIGS. 1A to 1C only in that four elastic contact pieces 43, 45, 47, and 49 respectively provided with tips 43a, 45a, 47a, and 49a serving as free ends are formed. Regarding other features, the configuration of the contact head 40 of this example is also identical to the configuration of the example shown in FIG. 1A to 1C and description of the configuration will therefore be omitted. It is to be noted that the configuration of the contact head 40 in this example can also be understood by reading the description of the example shown in FIGS. 1A to 1C above while replacing 1 in the tenths place of the reference numerals with 4. It is to be also noted that the contact head 40 according to this example is selected as the typical contact head and the explanation concerning operations and effects as well as a manufacturing method of the contact head according to the present invention will be made later using the contact head 40.

Figure 7A:
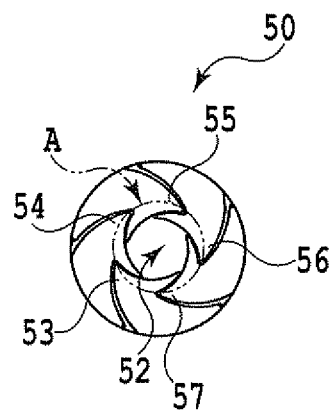
FIG. 7A is a top view of an example of a contact head according to the present invention, in which the number of elastic contact pieces provided at one end portion of the contact head is 5.
Figure 7B:
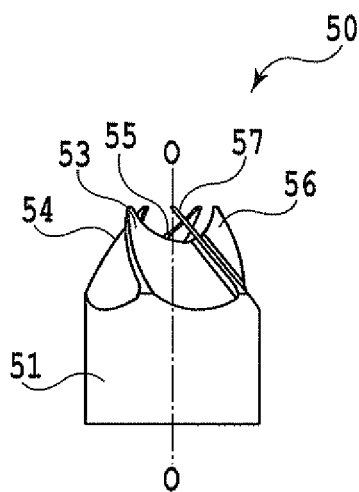
FIG. 7B is a side view of the contact head shown in FIG. 7A.
Figure 7C:
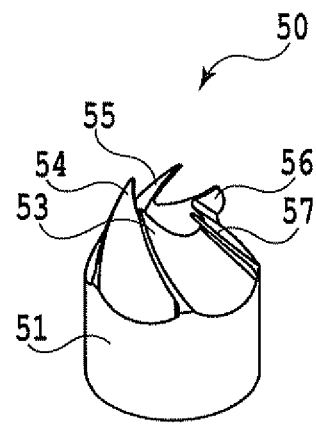
FIG. 7C is a perspective view of the contact head shown in FIG. 7A.

FIGS. 7A to 7C show a contact head 50 according to Example 7 of the present invention. The configuration of the contact head 50 shown in FIGS. 7A to 7C is different from that of the contact head 10 of the example shown in FIGS. 1A to 1C only in that five elastic contact pieces 53, 54, 55, 56, and 57 respectively provided with tips serving as free ends are formed. Regarding other features, the configuration of the contact head 50 of this example is also identical to the configuration of the example shown in FIG. 1A to 1C and description of the configuration will therefore be omitted. It is to be noted that the configuration of the contact head 50 in this example can also be understood by reading the description of the example shown in FIGS. 1A to 1C above while replacing 1 in the tenths place of the reference numerals with 5.

Figure 8A:
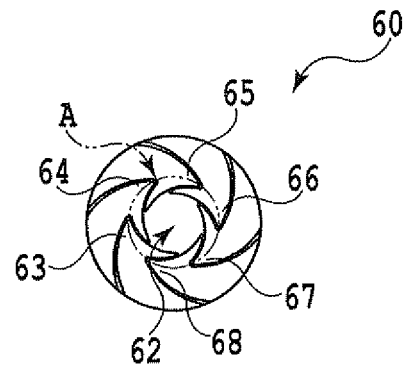
FIG. 8A is a top view of an example of a contact head according to the present invention, in which the number of elastic contact pieces provided at one end portion of the contact head is 6.
Figure 8B:
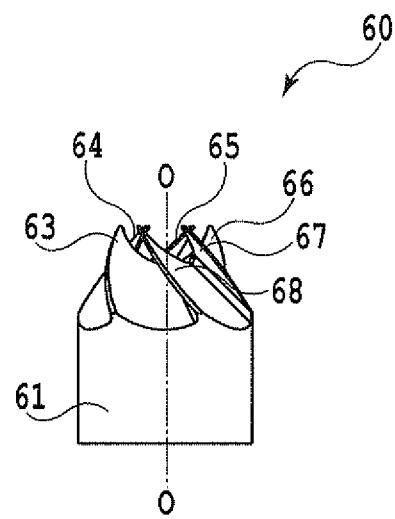
FIG. 8B is a side view of the contact head shown in FIG. 8A.
Figure 8C:
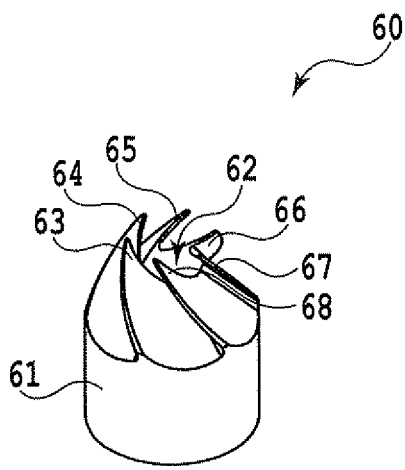
FIG. 8C is a perspective view of the contact head shown in FIG. 8A.

FIGS. 8A to 8C show a contact head 60 according to Example 8 of the present invention. The configuration of the contact head 60 shown in FIGS. 8A to 8C is different from that of the contact head 10 of the example shown in FIGS. 1A to 1C only in that six elastic contact pieces 63, 64, 65, 66, 67, and 68 respectively provided with tips serving as free ends are formed. Regarding other features, the configuration of the contact head 60 of this example is also identical to the configuration of the example shown in FIG. 1A to 1C and description of the configuration will therefore be omitted. It is to be noted that the configuration of the contact head 60 in this example can also be understood by reading the description of the example shown in FIGS. 1A to 1C above while replacing 1 in the tenths place of the reference numerals with 6.

Figure 9A:
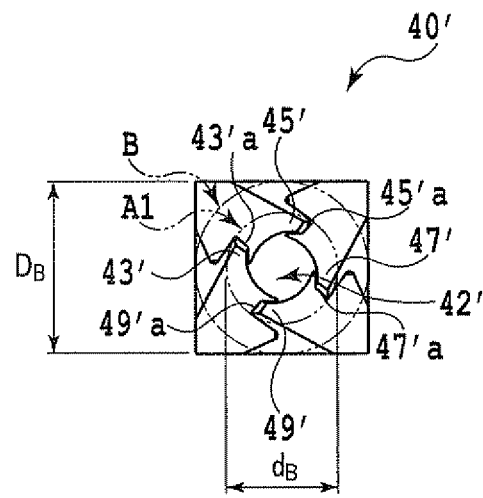
FIG. 9A is a top view of a contact head according to an example of the present invention, of which a horizontal cross-sectional shape is a square.
Figure 9B:
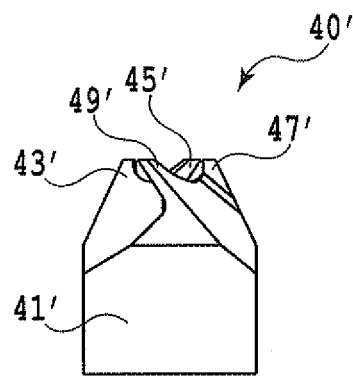
FIG. 9B is a side view of the contact head shown in FIG. 9A.
Figure 9C:
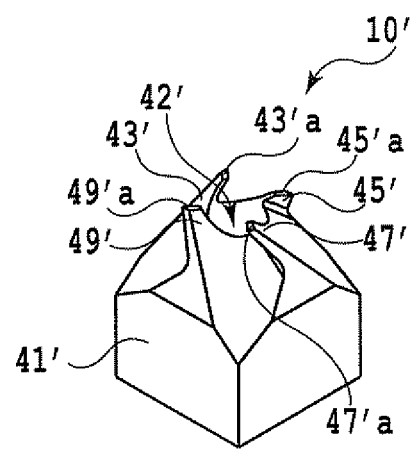
FIG. 9C is a perspective view of the contact head shown in FIG. 9A.

FIGS. 9A to 9C show a contact head 40' according to Example 9 of the present invention. The configuration of the contact head 40' shown in FIGS. 9A to 9C is different from that of the contact head 10 of the example shown in FIGS. 1A to 1C in that four elastic contact pieces 43', 45', 47', and 49' respectively provided with tips 43'a, 45'a, 47'a, and 49'a serving as free ends are formed, and that a horizontal cross-sectional shape of a head base 41' is a regular tetragon (a square). In the case of this example, a virtual circle A1 where the tips 43'a, 45'a, 47'a, and 49'a of the four elastic contact pieces 43', 45', 47', and 49' are to be located is set as a circle that is concentric with an inscribed circle B inscribed in the regular tetragonal head base 41' and has a diameter $d_B$ which is either the same as or smaller than a diameter $D_B$ of the inscribed circle B. In the contact head 40' of this example, the head base 41' is formed into a regular polygon (the regular tetragon). Therefore, when the contact head 40' is used for the above-described electrical connector and the like, it is possible to suppress rotation of the contact head 40' by changing the first through hole 82a in the first socket base member 82 to house the contact head 40' from the cylindrical shape into the regular polygonal shape. Regarding other features, the configuration of the contact head 40' of this example is also identical to the configuration of the example shown in FIG. 1A to 1C. It is to be noted that the configuration of the contact head 40' in this example can also be understood by reading the description of the example shown in FIGS. 1A to 1C above while replacing 1 in the tenths place of the reference numerals with 4 and attaching a suffix "'" to the reference numerals.

Figure 10A:
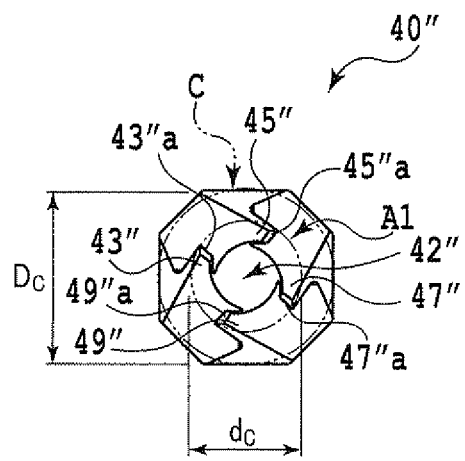
FIG. 10A is a top view of a contact head according to an example of the present invention, of which a horizontal cross-sectional shape is a regular octagon.
Figure 10B:
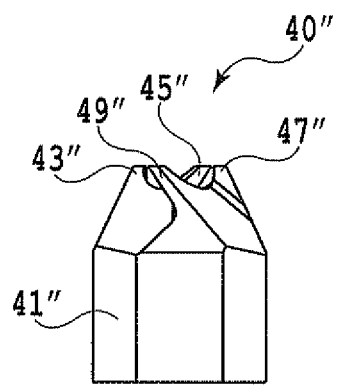
FIG. 10B is a side view of the contact head shown in FIG. 10A.
Figure 10C:
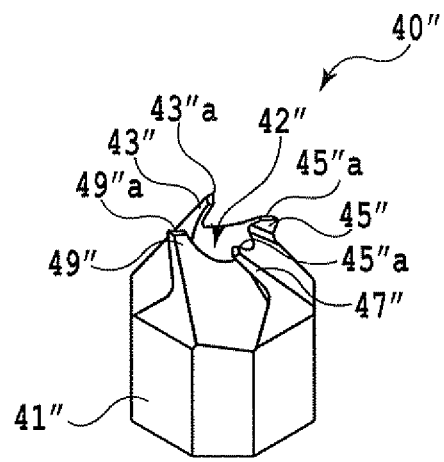
FIG. 10C is a perspective view of the contact head shown in FIG. 10A.

FIGS. 10A to 10C show a contact head 40" according to Example 10 of the present invention. The configuration of the contact head 40" shown in FIGS. 10A to 10C is different from that of the contact head 10 of Example 1 in that four elastic contact pieces 43", 45", 47", and 49" respectively provided with tips 43"a, 45"a, 47"a, and 49"a serving as free ends are formed, and that a horizontal cross-sectional shape of a head base 41" is a regular octagon. In other words, it is possible to say that this example is different from Example 9 described above only in that the horizontal cross-sectional shape of the head base 41" is the regular octagon. In the case of this example as well, a virtual circle A where the tips 43"a, 45"a, 47"a, and 49"a of the four elastic contact pieces 43", 45", 47", and 49" are to be located is set as a circle that is concentric with an inscribed circle C inscribed in the regular octagonal head base 41" and has a diameter $d_C$ which is either the same as or smaller than a diameter $D_C$ of the inscribed circle C. In the contact head 40" of this example as well, the head base 41" is formed into a regular polygon (the regular octagon). Therefore, when the contact head 40" is used for the above-described electrical connector and the like, it is possible to suppress rotation of the contact head 40" by changing the first through hole 82a in the first socket base member 82 to house the contact head 40" from the cylindrical shape into the regular polygonal shape. Regarding other features, the configuration of the contact head 40" of this example is also identical to the configuration of the example shown in FIG. 1A to 1C. It is to be noted that the configuration of the contact head 40" in this example can also be understood by reading the description of the example shown in FIGS. 1A to 1C above while replacing 1 in the tenths place of the reference numerals with 4 and attaching a suffix "''" to the reference numerals.

Figure 11:
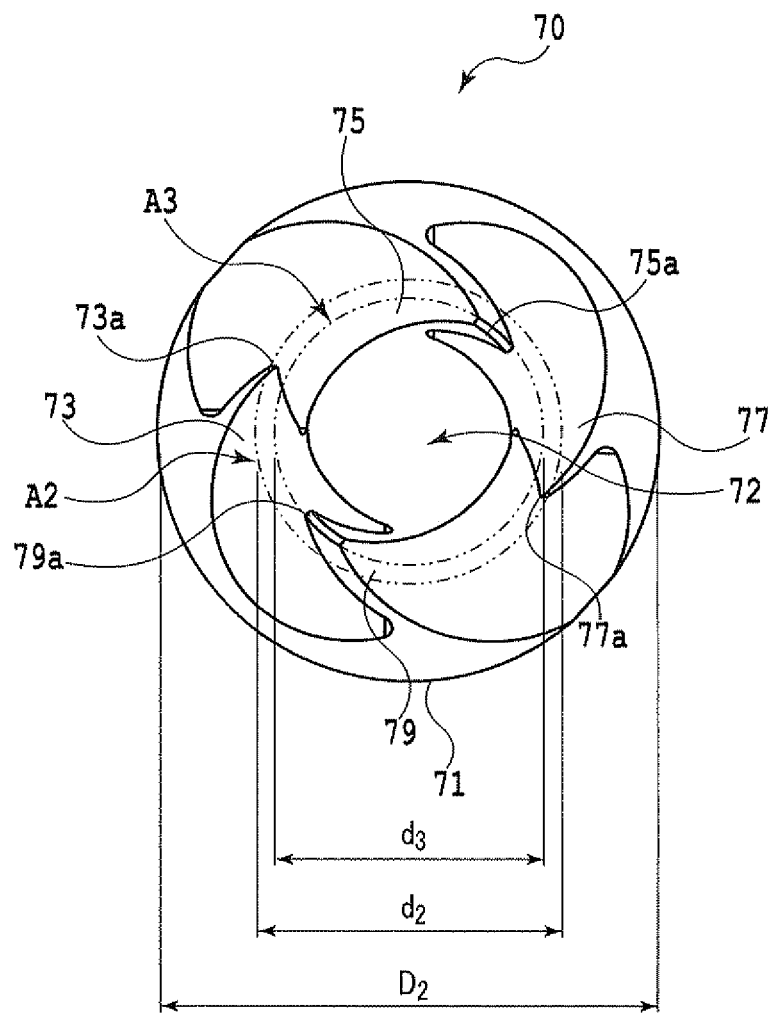
FIG. 11 shows an example of a contact head according to the present invention, in which the structure of the elastic contact pieces provided at one end portion of the contact head is different from any of the examples shown in FIG. 1 to FIG. 10C.

FIG. 11 shows a top view of a contact head 70 according to Example 11 of the present invention. The configuration of the contact head 70 shown in FIG. 11 is different from that of the contact head 10 of Example 1 in that four elastic contact pieces 73, 75, 77, and 79 respectively provided with tips 73a, 75a, 77a, and 79a serving as free ends are formed, and that there are two virtual circles where the respective tips 73a, 75a, 77a, and 79a of the four elastic contact pieces 73, 75, 77, and 79 are to be located. In the case of this example, a virtual circle A2 supposed to locate the two opposite elastic contact pieces 73 and 77 out of the four elastic contact pieces 73, 75, 77, and 79 is set to have a diameter $d_2$ which is either the same as or smaller than a diameter $D_2$ of a head base 71 having a cylindrical shape. Similarly, a virtual circle A3 supposed to locate the remaining two opposite elastic contact pieces 75 and 79 is set to have a diameter $d_3$ which is smaller than the diameter $d_2$ of the virtual circle A2. Moreover, in the case of this example, a dent 72 is formed into an inverted cone shape.

The contact heads 10 to 70 according to the present invention are not limited only to these configurations but are characterized by including at least two elastic contact pieces as described above. As a consequence, the respective tips of the at least two elastic contact pieces are displaceable in the vertical direction as the tips contact the electrodes serving as the contact target objects while applying a given pressure. Accordingly, the crush or deformation as observed in the conventional pointed end of the contact head is either totally eliminated or reduced even when the at least two elastic contact pieces of the contact head come into contact with the electrode. In addition, unintended damage on the electrodes can be avoided. Meanwhile, the tip end of the elastic contact piece is not deformed outward beyond the contour of the head base. Accordingly, when this contact head is used for the probe pin, the layout of the probe pin can be designed depending on the diameter of the probe pin. As a consequence, this structure can cope with narrower pitches. Now, a principle of contact between the elastic contact piece of the contact head according to the present invention and the electrode (the external contact point) of the contact target object will be briefly described with reference to FIGS. 18A to 18D. Although the contact head shown in FIGS. 18A to 18C employs the contact head 40 of Example 6 shown in FIGS. 6A to 6C, it is to be understood that substantially similar operations and effects can also be expected from other examples.

Figure 18D:
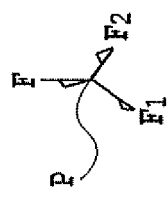
FIG. 18D is a view for explaining the principle of contact between the elastic contact piece of the contact head according to the present invention and the electrode of the contact target object, which is a vector diagram of forces acting on a contact point P in FIG. 18C.
Figure 18C:
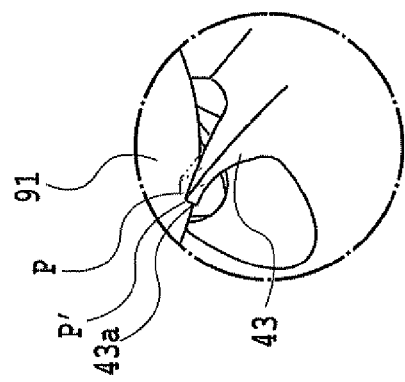
FIG. 18C is a view for explaining the principle of contact between the elastic contact piece of the contact head according to the present invention and the electrode of the contact target object, which is an enlarged view of a portion indicated with a circle XVIIIC in FIG. 18B.
Figure 18B:
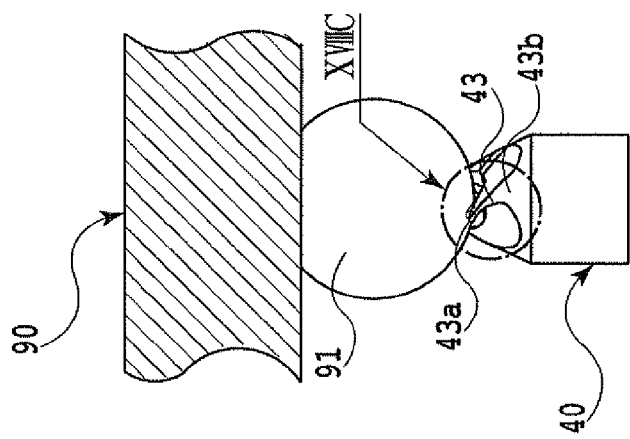
FIG. 18B is a view for explaining the principle of contact between the elastic contact piece of the contact head according to the present invention and the electrode of the contact target object, which is the view showing a contact state where the elastic contact piece and the electrode come into contact upon application of a given pressure.
Figure 18A:
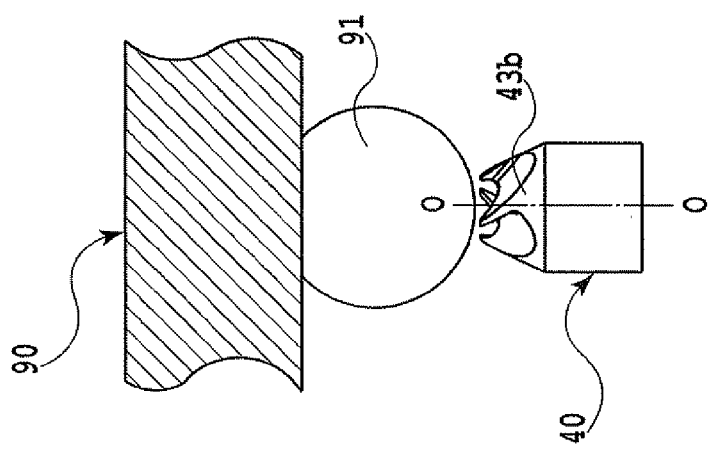
FIG. 18A is a view for explaining a principle of contact between the elastic contact piece of the contact head according to the present invention and an electrode of a contact target object, which is the view showing a noncontact state where the elastic contact piece does not contact the electrode.

The contact head 40 transitions from a state of noncontact shown in FIG. 18A to a state of contact shown in FIG. 18B with an electrode (a solder ball) 91 serving as an external electrode of an IC package 90 serving as a contact target object. Here, when attention is focused on the elastic contact piece 43 of the contact head 40, a tip end 43a of the elastic contact piece 43 firstly contacts a point P on a surface of the electrode 91 as shown in FIG. 18B and in FIG. 18C being an enlarged view of a substantial part thereof. Moreover, the tip end region of the elastic contact piece 43 including the tip end 43a is deformed as the IC package 90 is further pressed down. As illustrated in FIG. 18D, this aspect shows a state where a depressing force (an applied pressure) F is applied downward in the vertical direction to the tip end 43a of the elastic contact piece 43 in the contact point P on the surface of the electrode 91. In this case, when the elastic contact piece 43 is inclined as shown in this example, the depressing force F is divided into a force F1 in a normal direction and a force F2 in a tangential direction (i.e., a direction of extension of the elastic contact piece 43) at the tip end 43a as shown in FIG. 18D. Of these, the force F1 acts as a force to displace (warp) the elastic contact piece 43. Specifically, the tip end 43 of the elastic contact piece 43 is displaced in the vertical direction as described above by an action of a component force in the vertical direction of this force F1. At this time, the depressing force F to be received by each elastic contact piece becomes smaller as the number of the elastic contact pieces increases. Hence the elastic contact piece will not receive an excessive force and the crush or deformation of the elastic contact piece can therefore be reduced. Moreover, since a reactive force from the elastic contact piece is also reduced, damage on the electrode 91 can also be further suppressed.

The force F1 has the component force in the vertical direction and a component force in a horizontal direction as well. This component force in the horizontal direction acts as a force to move the tip end 43a of the elastic contact piece 43 leftward in FIG. 18C. If the contact head 40 is designed to be rotatable, the contact head 40 rotates around the central axis line O-O as a whole. In this case, the contact point P between the elastic contact piece 43 and the solder ball 90 moves along the elastic contact piece 43 toward the base end portion thereof. However, assuming that the contact head 40 is fixed to be unrotatable, this component force in the horizontal direction moves the contact point P between the elastic contact piece 43 and the solder ball 91 to a contact point P1 along the surface of the solder ball 91 as shown in FIG. 18C. From this fact, it is understood that the surface of the electrode 91 is rubbed (i.e., wiped) by the tip end 43a of the elastic contact piece 43 when the contact head 40 is rendered unrotatable. A contact head and a probe pin configured to exert this wiping action will be described later.

Next, a method of manufacturing the contact heads 10 to 70 according to the present invention will be briefly described by using FIGS. 19A to 19E. Although the contact head illustrated in FIGS. 19A to 19E similarly employs the contact head 40 of Example 6 shown in FIGS. 6A to 6C, the other contact heads can also be manufactured by a similar method.

Figure 19B:
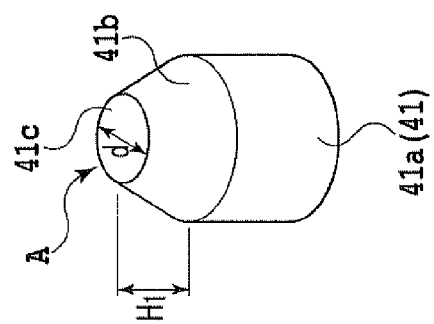
FIG. 19B is a process drawing for explaining manufacturing of a contact head according to the present invention, which shows a manufacturing step 2.
Figure 19A:
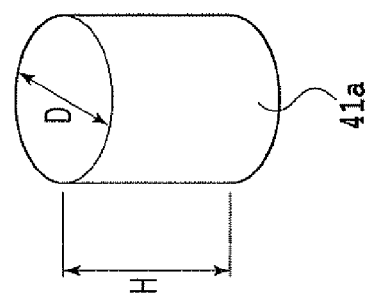
FIG. 19A is a process drawing for explaining manufacturing of a contact head according to the present invention, which shows a manufacturing step 1.

First, in step S1, a solid cylindrical rod (i.e., a solid cylinder) 41a having a predetermined height H and a predetermined diameter D is prepared as shown in FIG. 19A because the head base 41 of the contact head 40 to be manufactured has the cylindrical shape in this example.

In step S2, an upper portion of the solid cylinder 41a is cut into a tapered shape as shown in FIG. 19B so as to form a circular truncated cone portion 41b on the portion above the portion constituting the head base 41. At this time, the circle A, which is the predetermined virtual circle having the diameter d and being a location where the tips of the four elastic contact pieces of the contact head 40 are to be located as described previously, is formed on an upper end surface 41c of the circular truncated cone portion 41b concentrically with the horizontal cross-sectional surface of the solid cylinder 41a.

Next, in step S3, a dent 42 is formed downward from the upper end surface of the circular truncated cone portion 41b by cutting work or the like. At this time, the dent 42 is formed such that a diameter of an upper open portion of the dent 42 is formed as the same as or slightly smaller than the diameter d of the circle A on the upper end surface 41c formed in step S2. Although the shape of the dent 42 is preferably any of a cylindrical shape, an inverted cone shape, and an inverted circular truncated cone shape, the shape is not limited only to these configurations as long as the dent 42 can be manufactured easily in the manufacturing process. In short, the dent 42 only needs to have the upper end open portion in the circular shape with the diameter substantially equal to the diameter of the circle A.

In step S4, the circular truncated cone portion 41b around the dent 42 is formed into the elastic contact pieces by cutting the circular truncated cone portion 41b from outside toward the dent 42 substantially in the horizontal direction. In this case, the circular truncated cone portion 41b is practically cut out to form four spaces 41d between the adjacent elastic contact pieces.

In step S5, the contact head 40 including the four elastic contact pieces 43, 45, 47, and 49 is finished.

In this way, the contact head according to the present invention can be manufactured easily by cutting work in spite of the rather complicated structure.

Some examples, operations (functions), effects and the manufacturing method of the contact head according to the present invention have been described above. Now, probe pins including any of these contact heads and an electrical connector using the probe pins will be described below.

Figure 12:
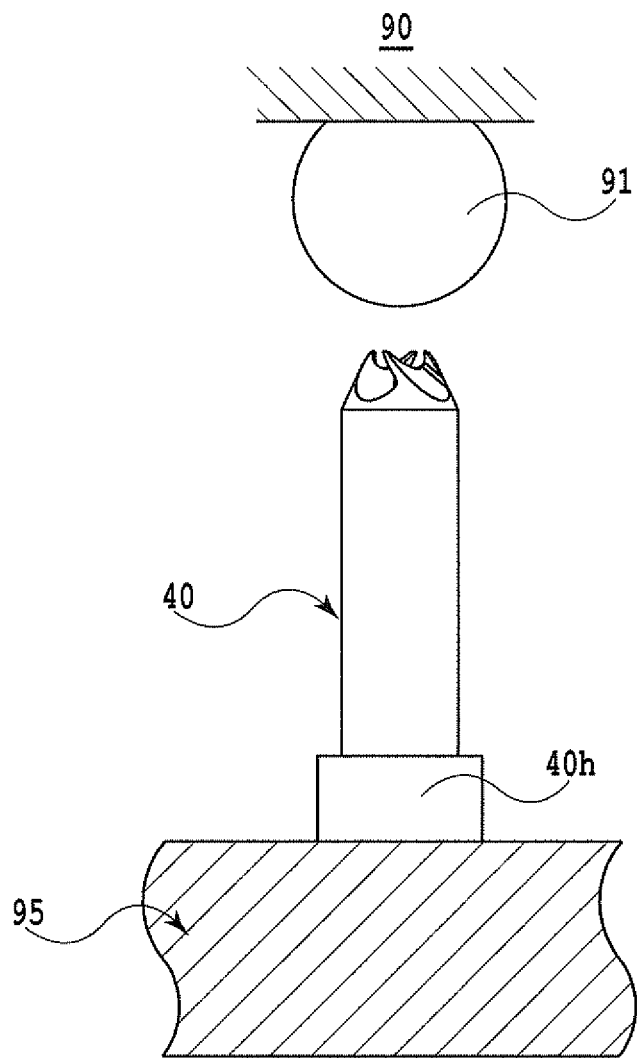
FIG. 12 shows an example of a probe pin including the contact head according to the present invention.

FIG. 12 shows an example of a type in which the contact head is used as the probe pin as it is. Although the contact head 40 of Example 6 shown in FIGS. 6A to 6C is used as the contact head in the example shown in FIG. 12, the other contact heads can also be used similarly as the probe pin.

As shown in FIG. 12, the contact head 40 constituting the probe pin is directly attached to an electrode serving as an external contact point of a printed wiring board 95 through a supporting portion (a large diameter portion or a wide portion) 40h by means of adhesion, soldering or press fitting. The contact head 40 and the supporting portion 40h may be formed integrally by using the same material or may be formed as separate components. The contact head 40 can electrically connect the printed wiring board 95 to the IC package 90 by bringing the printed wiring board 95 and the IC package 90 relatively close to each other. The four elastic contact pieces are elastically displaceable in the vertical direction when the elastic contact pieces come into contact with the electrode 91 of the IC package 90, and thereby absorb an impact at the time of contact. Accordingly, the contact pieces are prevented from undergoing crush or deformation of the tips thereof and from damaging the electrode.

Figure 13:
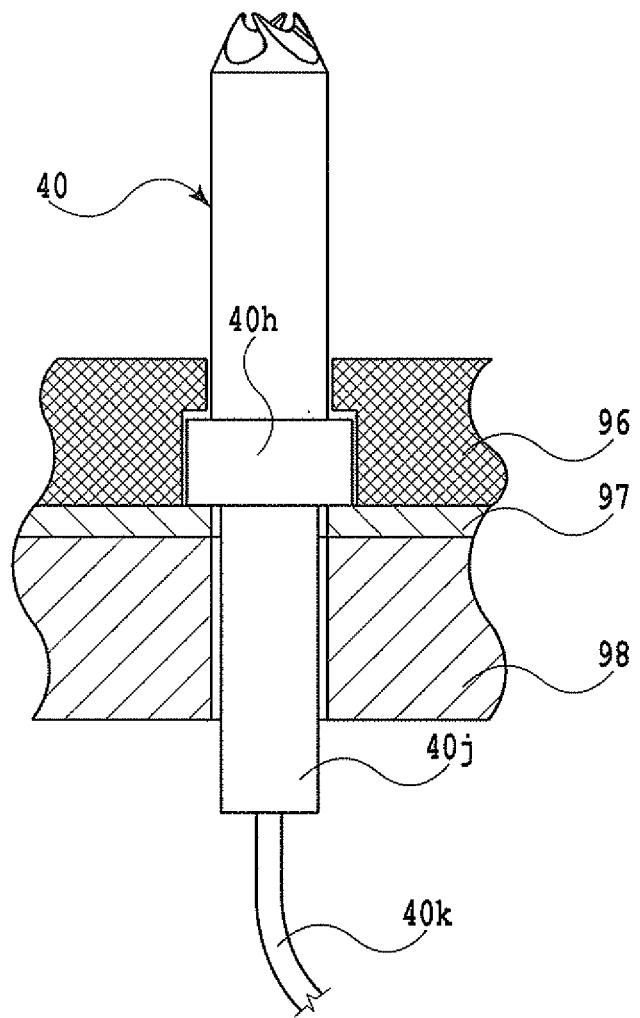
FIG. 13 shows another example of a probe pin including the contact head according to the present invention.

FIG. 13 shows another example of the type in which the contact head is used as the probe pin as it is. Although the contact head 40 of Example 6 shown in FIGS. 6A to 6C is used as the contact head in the example shown in FIG. 13 as well, the other contact heads can also be used similarly.

As shown in FIG. 13, in this example, the contact head 40 further includes the supporting portion 40h, a joint portion 40j, and a connecting wire 40k, and is attached to a supporting substrate 98 through an elastic body 97. This example is configured to be capable of absorbing the impact at the time of contact between the contact head 40 and the electrode by using not only the four elastic contact pieces but also the elastic body 97 in such a case where the contact head 40 is electrically connected to the electrode of the IC package shown in FIG. 12, for example. In this example, the contact head 40 is connected to a probe card substrate, for example, through the joint portion 40j and the connecting wire 40k. Note that reference numeral 96 denotes a fastening member configured to hold the contact head 40 and the elastic body 97 onto the supporting substrate 98.

FIGS. 14 to 17 show four examples of a type in which the contact head is used as a so-called probe pin. Although the contact head 40 of Example 6 shown in FIGS. 6A to 6C is used as the contact head in the examples shown in FIGS. 14 to 17 as well, the other contact heads can also be used similarly.

Figure 14:
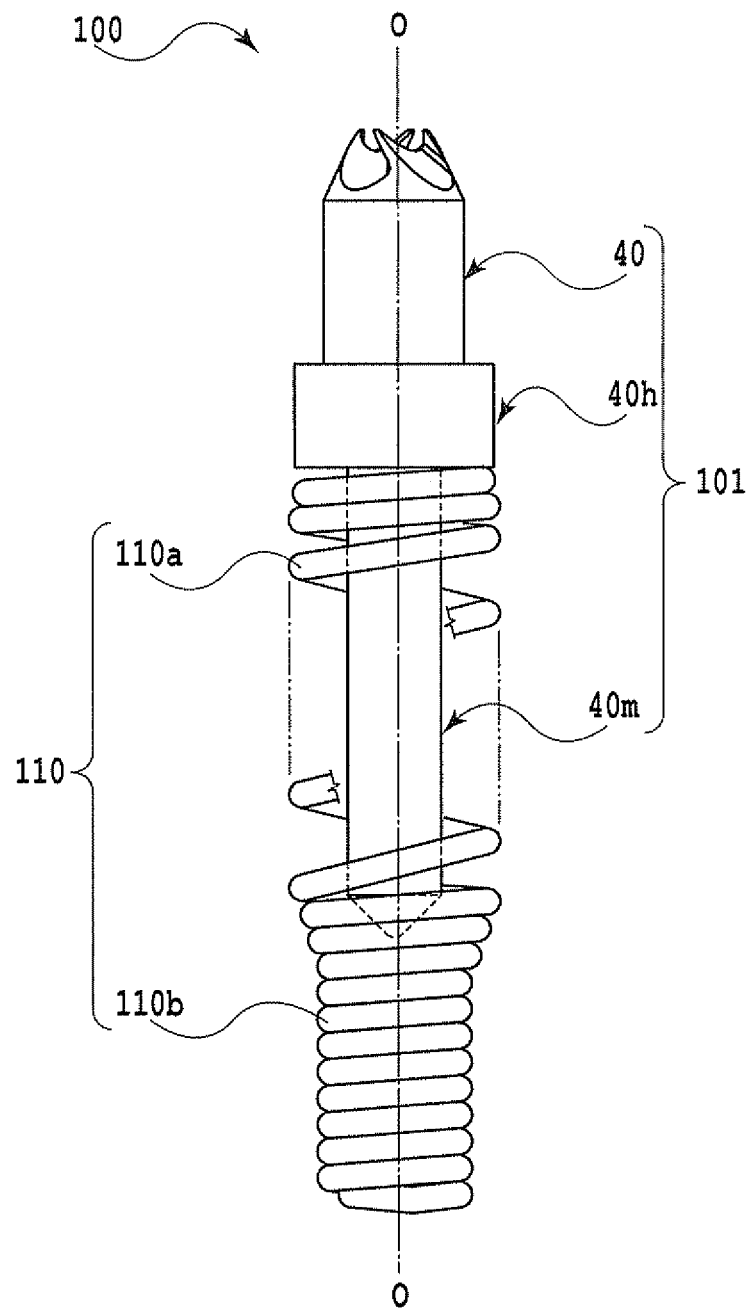
FIG. 14 shows still another example of a probe pin including the contact head according to the present invention.

A probe pin 100 shown in FIG. 14 includes a plunger portion 101 having the contact head 40, the large diameter portion 40h serving as the supporting portion and a lower contact piece 40m, and includes a coil unit portion 110. The plunger portion 101 is preferably formed integrally by using the same material. The coil unit portion 110 includes a coil spring portion 110a which is elastically deformable and a tightly wound portion 110b of which a lower end portion connects to an external contact point such as a printed board. The probe pin 100 of this example can be used as the probe pin of the above-described electrical connector 80. When the probe pin 100 of this example is electrically connected to the electrode of the IC package as previously shown in FIG. 12, for example, the probe pin 100 can absorb the impact at the time of contact not only by using the four elastic contact pieces but also by using the coil spring portion 110a. In this example, an electrical path is completed as the contact head 40 is pressed down, the lower contact piece 40m integrated therewith is inserted into the tightly wound portion 110b, and the lower contact piece 40m contacts the tightly wound portion 110b.

Figure 15:
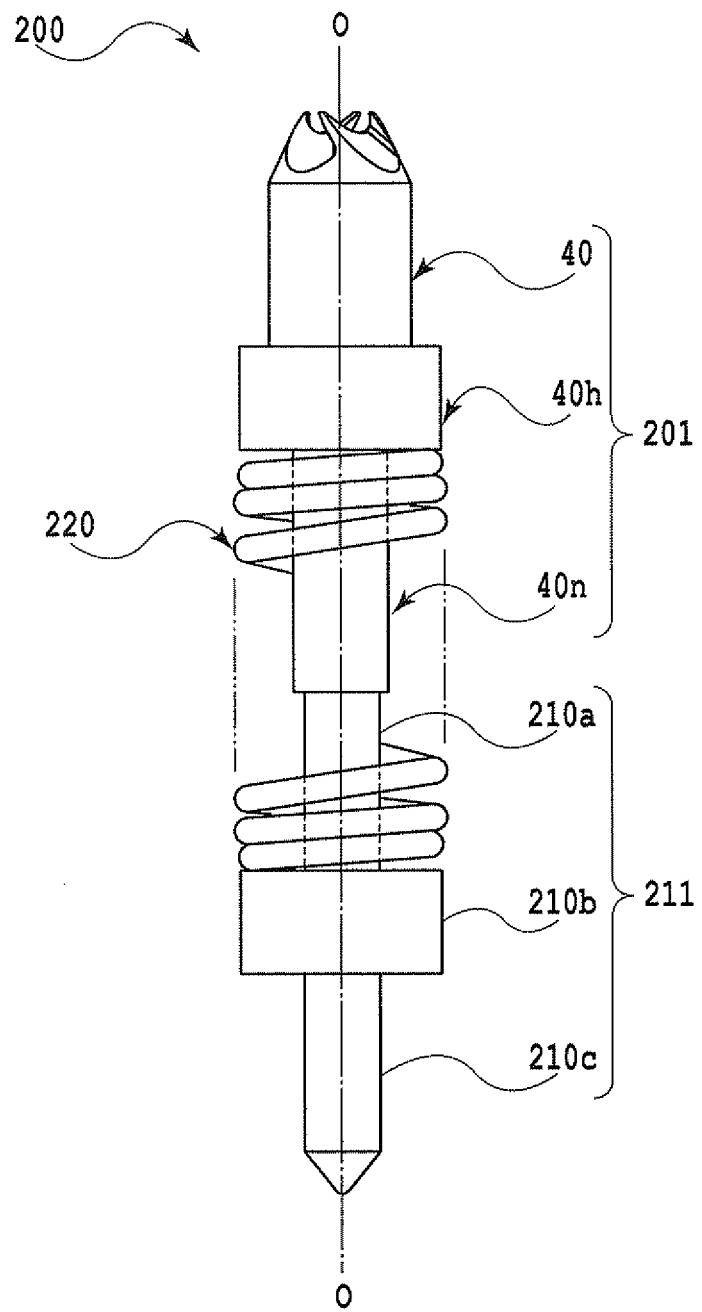
FIG. 15 shows still another example of a probe pin including the contact head according to the present invention.

A probe pin 200 shown in FIG. 15 includes: an upper member 201 having the contact head 40, a first supporting portion 40h and a cylinder portion 40n; a lower member 211 having a plunger portion 210a, a second supporting member 210b and a lower contact point portion 210c; and a coil spring 220. The plunger portion 210a of the lower member is fitted into the cylinder portion 40n of the upper member so as to be movable in the up-and-down direction. The coil spring 220 is located between the first supporting member 40h serving as the large diameter portion of the upper member 201 and the second supporting member 210b serving as the large diameter portion of the lower member 211 and on the outside of the cylinder 40n and the plunger portion 210a, and is configured to bias the upper member 201 and the lower member 211 in directions to move away from each other. The probe pin 200 of this example can also be used as the probe pin of the above-described electrical connector 80.

When the probe pin 200 of this example is electrically connected to the electrode of the IC package as previously shown in FIG. 12, for example, the probe pin 200 can absorb the impact at the time of contact not only by using the four elastic contact pieces but also by using the coil spring 220. In this example, an electrical path is completed as the contact head 90 is pressed down, and then the plunger portion 210a moves upward inside the cylinder portion 40n integrated with the contact head 40 and contacts the cylinder portion 40n. In this example, it is also possible to form the lower contact point portion 210c of the lower member by using the contact head 40 according to the present invention.

Figure 16:
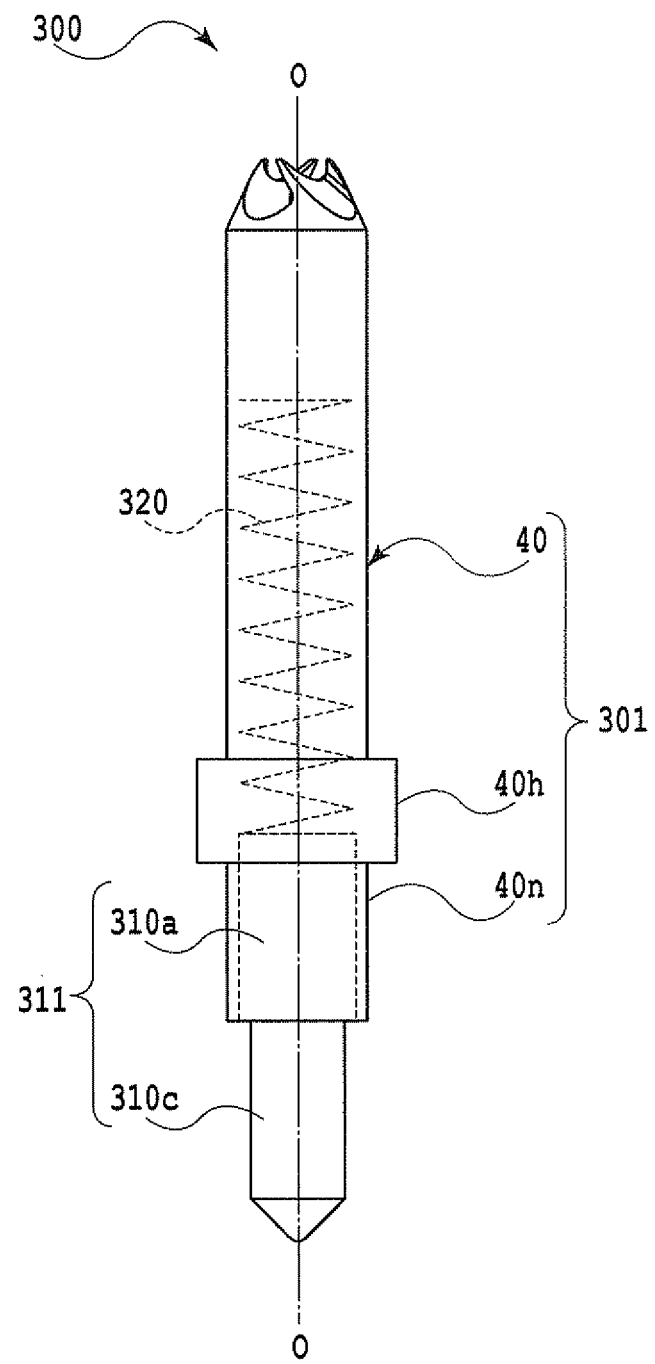
FIG. 16 shows still another example of a probe pin including the contact head according to the present invention.

A probe pin 300 shown in FIG. 16 includes: an upper member 301 having the contact head 40, the first supporting portion 40h and the cylinder portion 40n; a lower member 311 having a plunger portion 310a and a lower contact point portion 310c; and a coil spring 320. The cylinder portion 40n is formed as a hollow cylinder having an internal space. As shown in FIG. 16, the internal space of the cylinder portion 40n may penetrate the first supporting portion 40h and extend into the head base of the contact head 40. The plunger portion 310a of the lower member is fitted into the cylinder portion 40n of the upper member so as to be movable in the up-and-down direction. In addition, although the following feature is not clearly illustrated in the drawing, the plunger portion 310a in this example is preferably formed to have a larger diameter than a diameter of the lower contact point portion 310c so as not to fall out of the cylinder portion 40n. Moreover, in this example, the coil spring 320 is located between the cylinder portion 40n of the upper member and the plunger portion 310a of the lower member and on the inside of the cylinder 40n, and is configured to bias the upper member and the lower member in directions to move away from each other. That is to say, the only practical difference between the probe pin 300 of this example and the probe pin 200 previously shown in FIG. 15 is the layout of the coil spring 320, and the rest of the configurations are almost the same. The probe pin 300 of this example can also be used as the probe pin of the above-described electrical connector 80.

When the probe pin 300 of this example is electrically connected to the electrode of the IC package, for example, the probe pin 300 can also absorb the impact at the time of contact not only by using the four elastic contact pieces but also by using the coil spring 320. In this example as well, an electrical path is completed as the contact head 40 is pressed down, and then the plunger portion 310a moves upward inside the cylinder portion 40n integrated with the contact head 40 and contacts the cylinder portion 40n. In this example as well, it is also possible to form the lower contact point portion 310c of the lower member by using the contact head 40 according to the present invention.

Figure 17:
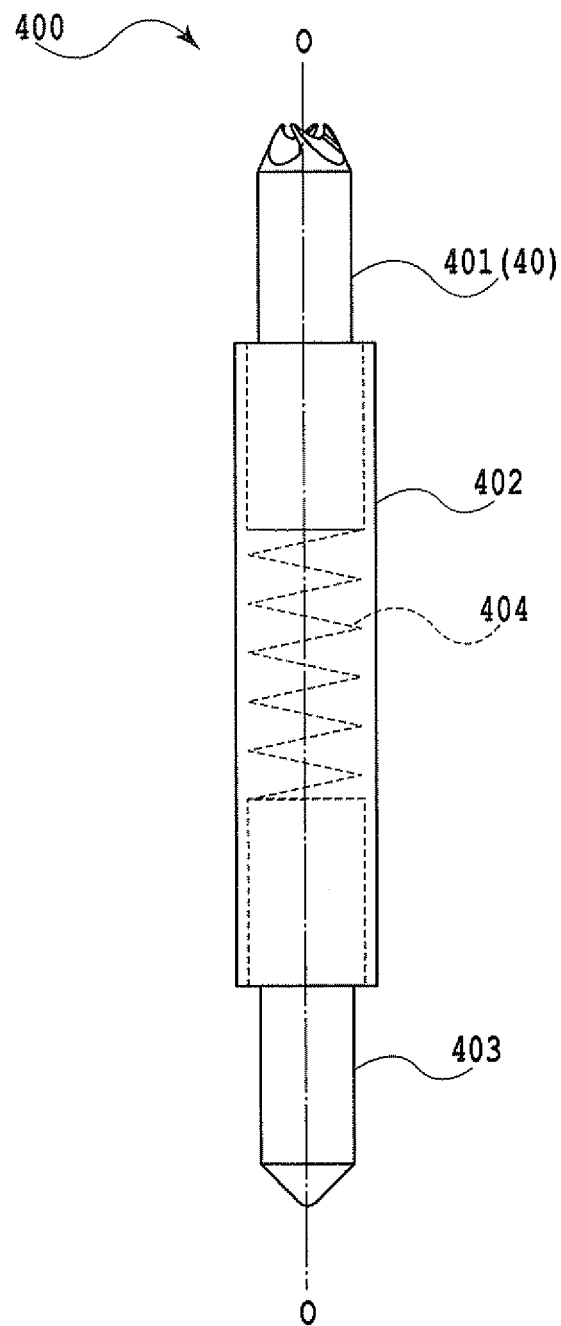
FIG. 17 shows still another example of a probe pin including the contact head according to the present invention.

A probe pin 400 shown in FIG. 17 includes: an upper plunger 401 having the contact head 40; a cylinder member (a tubular body) 402; a lower plunger 403; and a coil spring 404. The upper and lower plungers 401 and 403 are fitted into the cylinder member 402 so as to be movable in the up-and-down direction. In this example, although the following feature is not clearly illustrated in the drawing, the upper and lower plungers 401 and 403 are preferably formed not to fall out of the cylinder member 402. Moreover, in this example, the coil spring 404 is located between the upper plunger 401 and the lower plunger 403 and on the inside of the cylinder member 402, and is configured to bias the upper plunger 401 and the lower plunger 403 in directions to move away from each other. The only practical difference between the probe pin 400 of this example and the plunger pin 300 previously shown in FIG. 15 is the layout of the coil spring 404, and the rest of the configurations are almost the same. The probe pin 400 of this example can also be used as the probe pin of the above-described electrical connector 80.

When the probe pin 400 of this example is electrically connected to the electrode of the IC package, for example, the probe pin 400 can also absorb the impact at the time of contact not only by using the four elastic contact pieces but also by using the coil spring 404. In this example, the contact head 40 is pressed down and then the upper plunger 401 formed of the contact head 40 moves downward inside the cylinder 402 and contacts the cylinder 402. In the meantime, the lower plunger 403 contacts the electrode on the printed wiring board 95, for example, moves upward inside the cylinder 402 by being pushed up, and contacts the cylinder 402. In this way, an electrical path of the probe pin 400 of this example is completed. In this example as well, it is also possible to form the lower plunger 403 by using the contact head 40 according to the present invention.

Lastly, examples of the contact head, the probe pin, or the electrical connector configured to exert the wiping action will be explained. As described previously, it is preferable to render the contact head or the probe pin unrotatable relative to the electrode to contact as shown in FIG. 12, for example, in order to allow the contact head or the probe pin to exert the wiping action. Nevertheless, it is practically impossible to render the probe pins in FIGS. 14 to 17 unrotatable, and the wiping actions thereof tend to be slightly suppressed as well. FIGS. 20A to 20C, 21, and 22 show three examples of the contact head or the probe pin configured to exert the wiping action better. The structures shown in these examples are configured to suppress rotation of the contact head or the probe pin. Although the contact head 40 of Example 6 shown in FIGS. 6A to 6C is used as the contact head in the examples shown in FIGS. 20A to 20C, 21, and 22 as well, the other contact heads can also be used similarly. The configurations to achieve exertion of the wiping action are not limited only to the following examples but other modifications and changes including combinations of any of these examples are also possible.

Figure 20A:
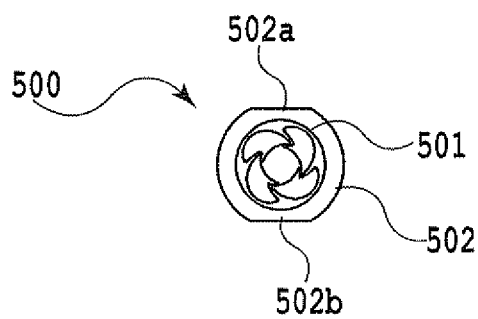
FIG. 20A is a view for explaining a method of preventing a probe pin from rotation, which shows a top view of the probe pin.
Figure 20B:
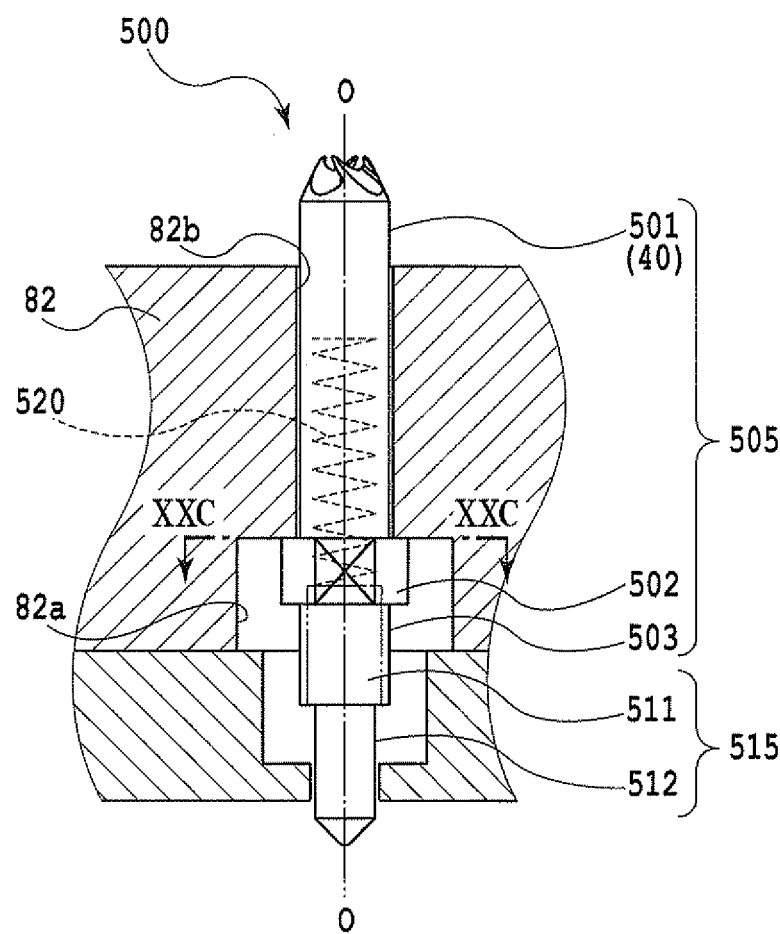
FIG. 20B is a view for explaining the method of preventing the probe pin from rotation, which shows a schematic cross-sectional view in the case where the probe pin is fitted in an electrical connector.
Figure 20C:
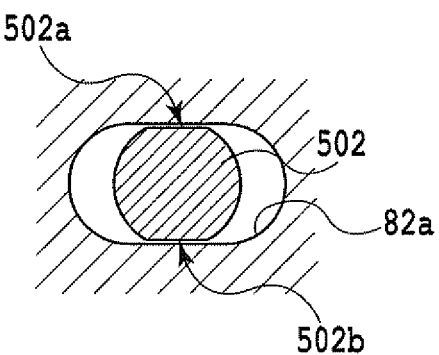
FIG. 20C is a view for explaining the method of preventing the probe pin from rotation, which shows a partial cross-sectional view taken along a XXC-XXC line in FIG. 20B.

The example shown in FIGS. 20A to 20C is an example of suppressing rotation of a contact head by means of a probe pin and an electrical connector. A probe pin 500 shown in FIGS. 20A to 20C includes: an upper member 505 having a contact head 501, a supporting portion 502 and a cylinder portion 503; a lower member 515 having a plunger portion 511 and a lower contact point portion 512; and a coil spring 520. As can be understood from this configuration, the probe pin 500 of this example has substantially the same configuration as that of the probe pin 300 previously shown in FIG. 16. Therefore, in this example, the contact head 501 is identical to the contact head 40 and the four elastic contact pieces are formed on the upper end thereof. Moreover, the internal space formed in the cylinder 503 and configured to house the coil spring 520 is also formed inside the head base of the contact head 501 beyond the first supporting portion 502. The probe pin 500 of this example is assumed to be used for the above-described electrical connector 80.

In this example, in order to suppress rotation of the contact head 501, the horizontal cross-sectional shape of the supporting portion 502 serving as the large diameter portion formed integrally with the contact head 501 is formed into the shape as clearly shown in FIGS. 20A and 20C by partially cutting out the horizontal cross-sectional circle. To be more precise, arc portions of the supporting portion 502, which are opposite to each other when the horizontal cross-sectional circle is viewed from above, are cut out and thus the opposite portions cut out are formed into parallel flat surfaces 502*a* and 502*b*. In the meantime, the horizontal cross-sectional shape of the first cylindrical through hole 82*a*, which is formed in the first socket base member 82 that constitutes the probe pin housing space of the electrical connector 80 to house the supporting portion 502, is also formed into the same shape as the horizontal cross-sectional shape of the supporting portion 502. Although the first through hole 82*a* is drawn in an extremely large shape in FIGS. 20B and 20C, rotation of the supporting portion 502 relative to the first socket base member 82 is suppressed by forming the horizontal cross-sectional shape of the first cylindrical through hole 82*a* as the same as the horizontal cross-sectional shape of the supporting portion 502. Hence rotation of the contact head 501 being integrally formed with the supporting body 502 relative to the first socket base member 82 is suppressed. Therefore, the electrode surface of the IC package mounted on the contact head 501 is wiped by the tips of the four elastic contact pieces of the contact head 501 as the IC package comes into contact with the contact head 501 and presses the contact head 501 down. In a conceivable modification of this example, the horizontal cross-sectional shape of the supporting portion 502 may be formed into a regular polygon while the horizontal cross-sectional shape of the first through hole 82*a* provided in the first socket base member 82 of the electrical connector 80 may be formed as the same as the above-described example or into the same regular polygon as the horizontal cross-sectional shape of the supporting portion 502. Alternatively, the horizontal cross-sectional shape of the contact head 501 itself may be formed into any of the regular polygons as shown in FIG. 9A to 9O and FIG. 10A to 10C. In this case, the horizontal cross-sectional shape of the small diameter portion 82*b* for fitting the head base of the contact head 501, the portion 82*b* belonging to the first through hole 82*a* provided in the first socket base member 82, is formed into the same regular polygon as the horizontal cross-sectional shape of the contact head 501.

Figure 21:
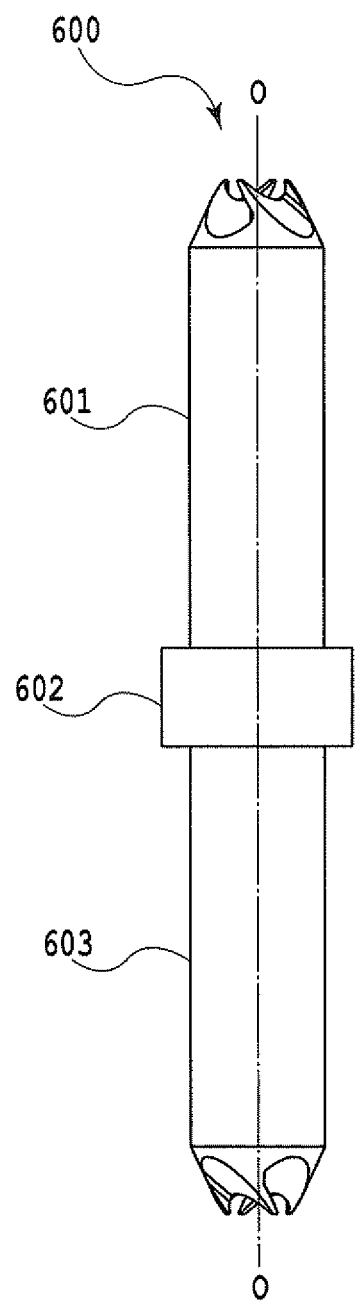
FIG. 21 is a view for explaining another method of preventing the probe pin from rotation.

A probe pin 600 shown in FIG. 21 is configured to suppress rotation by the probe pin itself. In this example, the probe pin 600 includes an upper contact head 601, a supporting portion (a large diameter portion) 602, and a lower contact head 603. In the probe pin 600 according to this example, the upper contact head 601, the supporting portion 602, and the lower contact head 603 are integrally formed. Four elastic contact pieces of the upper contact head 601 are formed to extend spirally clockwise from the respective base end portions when viewed from above and to be inclined upward from a horizontal upper end surface of a head base thereof. Meanwhile, four elastic contact pieces of the lower contact head 603 are formed to extend spirally clockwise from the respective base end portions when viewed from below and to be inclined downward from a horizontal lower end surface of a head base thereof. The four elastic contact pieces of the lower contact head 603 are arranged to extend spirally counterclockwise when viewed from above. In the probe pin 600 according to this example, the four elastic contact pieces of the upper contact head 601 are assumed to contact an electrode of an IC package under a given pressure while the four elastic contact pieces of the lower contact head 603 are assumed to contact an electrode of a printed wiring board under a given pressure, for instance. In this case, all the four elastic contact pieces of the upper contact head 601 receive a clockwise force when viewed from above while all the four elastic contact pieces of the lower contact head 603 receive a counterclockwise force. This fact shows that the upper and lower contact heads 601 and 603 receive the forces in the opposite directions. One of the forces thus received in the opposite directions cancels the other one of the forces thus received. Therefore, rotation of the probe pin 600 is suppressed on the whole. As a consequence, the upper contact head 601 wipes the electrode of the IC package while the lower contact head wipes the electrode of the printed wiring board.

Figure 22:
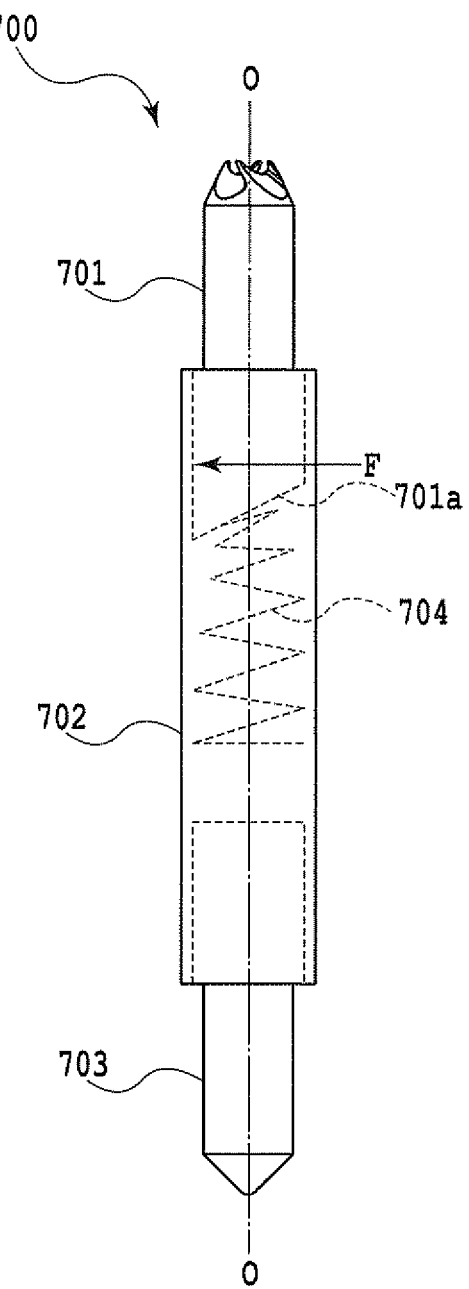
FIG. 22 is a view for explaining still another method of preventing the probe pin from rotation.

A probe pin 700 shown in FIG. 22 is also configured to suppress rotation by the probe pin itself. In this example, the configuration of the probe pin 700 is substantially the same as that of the probe pin 400 previously shown in FIG. 17. Specifically, the probe pin 700 of this example includes a contact head 701 serving as an upper plunger, a cylinder member (a tubular body) 702, a lower plunger 703, and a coil spring 704. The upper and lower plungers 701 and 703 are fitted in the cylinder member 702 so as to be movable in the up-and-down direction inside the cylinder member 702. Moreover, the probe pin 700 has the same structure as the probe pin 400 also in the way that the coil spring 704 is located between the upper plunger 701 and the lower plunger 703 and inside the cylinder member 702. This example is different from the configuration of the probe pin 400 in that a lower end surface 701*a* of the upper plunger 701 is formed as an inclined surface (formed as the surface inclined downward to the left in FIG. 22). Since the lower end surface 701*a* is formed as the inclined surface as described above, the upper plunger 701 receives a leftward reactive force F from the spring 704 upon receipt of a depressing force due to contact with an electrode of an IC package, for example, whereby the upper plunger 701 is pressed against an internal wall of the cylinder 702. Accordingly, friction between the upper plunger 701 and the cylinder 702 acts to prevent rotation of the contact head 701 serving as the upper plunger. As a consequence, the four elastic contact pieces of the upper plunger 701 wipe the electrode of the IC package.

In addition, the probe pin configured to suppress rotation of the contact head may include the probe pin (the combination of the contact head 40 and the supporting portion 40a) of the example shown in FIG. 12. Moreover, a case of using the contact head 20 shown in FIGS. 4A to 4C as the probe pin is also conceivable. As described previously, in the contact head 20 shown in FIGS. 4A to 4C, the two elastic contact pieces 23 and 25 are formed line-symmetrically with respect to the center line $O_1$-$O_1$. As shown in FIGS. 4A to 4C, one of the elastic contact pieces 23 is formed to extend spirally counterclockwise as seen in FIGS. 4A to 4C and to be inclined upward from the horizontal upper end surface of the head base 21. On the other hand, the other elastic contact piece 25 is formed to extend spirally clockwise as seen in FIGS. 4A to 4C and to be inclined upward from the horizontal upper end surface of the head base 21. Therefore, when the contact head 20 is pressed from above to come into contact with the electrode of the IC package, for example, the one elastic contact piece 23 receives a counterclockwise force while the other elastic contact piece 25 receives a clockwise force. As a result, the forces received by the respective pieces cancel each other, and rotation of the contact head 20 is thereby prevented.

Reference Signs List
10, 20, 30, 40, 50, 60, 70 CONTACT HEADS
11 HEAD BASE
12 DENT
13, 15 ELASTIC CONTACT PIECES
80 ELECTRICAL CONNECTOR
82 FIRST SOCKET BASE MEMBER
82a FIRST CYLINDRICAL THROUGH HOLE (PROBE HOUSING SPACE)
83 SECOND SOCKET BASE MEMBER
83a SECOND CYLINDRICAL THROUGH HOLE (PROBE HOUSING SPACE)
90 IC PACKAGE
92 ELECTRODE (SOLDER BALL)
100, 200, 300, 400, 600, 700 PROBE PINS

The invention claimed is:

1. A contact head comprising:
a head base; and
at least two elastic contact pieces located on an upper end portion of the head base and configured to electrically contact a contact target object, wherein
a dent having a circular horizontal cross-sectional shape is formed at a central portion surrounded by the at least two elastic contact pieces,
each of the elastic contact pieces has a tip end serving as a free end thereof and a base end portion continuous to the head base, and
each of the elastic contact pieces is formed to be elastically deformable in a vertical direction by being formed to extend spirally with the tip end located on a circumference of at least one virtual circle which is a circle concentric with an inscribed circle inscribed in a horizontal cross-sectional shape of the head base and which has a diameter being smaller than a diameter of the inscribed circle, and being formed into a shape so as to spread out wide from the tip end toward the base end portion.

2. A probe pin wherein the probe pin uses the contact head according to claim 1.

3. The probe pin according to claim 2 further comprising:
an elastic member configured to bias the contact head toward the contact target object.

4. The probe pin according to claim 3, wherein the elastic member is a coil spring.

5. An electrical connector comprising at least:
the probe pin according to claim 4; and
a socket base member including a housing space configured to house the probe pin.

6. The electrical connector according to claim 5, wherein the probe pin comprises:
the contact head;
a supporting portion serving as a wide portion supporting the contact head;
a cylinder portion; and
a lower plunger portion, wherein
the supporting portion has a horizontal cross-sectional shape in which opposite arcs of a circle are cut out and replaced with parallel lines,
the lower plunger is movable in an up-and-down direction inside the cylinder portion, and
the socket base member is formed such that a horizontal cross-sectional shape of the housing space housing the probe pin therein has the same shape as the horizontal cross-sectional shape of the supporting portion.

7. The probe pin according to claim 2, wherein
the contact heads are used in both of upper and lower ends, and
an extension direction of the at least two elastic contact pieces of one of the contact heads is clockwise when viewed from above and an extension direction of the at least two elastic contact pieces of the other one of the contact heads is counterclockwise when viewed from above.

8. An electrical connector comprising at least:
the probe pin according to claim 7; and
a socket base member including a housing space housing the probe pin therein.

* * * * *